(12) United States Patent
Awad et al.

(10) Patent No.: US 6,999,509 B2
(45) Date of Patent: Feb. 14, 2006

(54) METHOD AND APPARATUS FOR GENERATING A SET OF FILTER COEFFICIENTS FOR A TIME UPDATED ADAPTIVE FILTER

(75) Inventors: Thomas Jefferson Awad, Kirkland (CA); Pascal Marcel Gervais, Montreal (CA); Martin Laurence, Montreal (CA)

(73) Assignee: Octasic Inc., Montreal (CA)

( * ) Notice: Subject to any disclaimer, the term of this patent is extended or adjusted under 35 U.S.C. 154(b) by 751 days.

(21) Appl. No.: 09/925,231

(22) Filed: Aug. 8, 2001

(65) Prior Publication Data

US 2003/0031242 A1 Feb. 13, 2003

(51) Int. Cl.
*H03H 7/30* (2006.01)
*H03H 7/40* (2006.01)
*H03K 5/159* (2006.01)

(52) U.S. Cl. .................. 375/232; 708/323; 375/229; 375/230

(58) Field of Classification Search ............... 375/232, 375/229, 230, 231, 233
See application file for complete search history.

(56) References Cited

U.S. PATENT DOCUMENTS 5,062,102 A   10/1991   Taguchi
5,117,418 A   5/1992   Chaffee et al.

(Continued)

FOREIGN PATENT DOCUMENTS

EP   0709958 A1   5/1996
EP   0872962 A2   10/1998
EP   0982861 A2   3/2000
GB   2164828 A    3/1986

OTHER PUBLICATIONS

Deisher, M.E. et al., "Practical Considerations in the Implementation of a Frequency–Domain Adaptive Noise Canceller", IEEE Transactions on Circuits and Systems, II; Analog and Digital Signal Processing, IEEE Inc. New York, US, vol. 41, No. 2, Feb. 1, 1994, pp. 164–168, XP000443037.

(Continued)

*Primary Examiner*—Stephen Chin
*Assistant Examiner*—Jia Lu
(74) *Attorney, Agent, or Firm*—Wolf, Greenfield & Sacks, P.C.

(57) ABSTRACT

An apparatus and method suitable for producing a set of filter coefficients are provided. Sequences of samples of first and second signals are received by the apparatus. Each received sample is processed to update a set of auto-correlation data elements and cross-correlation data elements. The set of auto-correlation data elements corresponds to a compressed version of a corresponding auto-correlation matrix data structure. A scheduling controller generates a scheduling signal including a succession of scheduling commands, the scheduling command indicating that a new set of filter coefficients is to be computed. A new scheduling command is issued when at least two samples of first and second signals are received subsequent to a previously issued scheduling command. In response to a scheduling command, the auto-correlation data elements are processed to generate the auto-correlation matrix data structure. The auto-correlation matrix data structure and the cross-correlation data elements are processed to generate a set of filter coefficients by applying a least squares method.

32 Claims, 8 Drawing Sheets

U.S. PATENT DOCUMENTS

| | | | |
|---|---|---|---|
| 5,200,915 A | | 4/1993 | Hayami et al. |
| 5,329,587 A | | 7/1994 | Morgan et al. |
| 5,375,147 A | | 12/1994 | Awata et al. |
| 5,442,569 A | | 8/1995 | Osano |
| 5,526,426 A | | 6/1996 | McLaughlin |
| 5,630,154 A | | 5/1997 | Bolstad et al. |
| 5,790,598 A | | 8/1998 | Moreland et al. |
| 5,889,857 A | | 3/1999 | Boudy et al. |
| 5,912,966 A | * | 6/1999 | Ho .................. 379/406.05 |
| 5,974,377 A | | 10/1999 | Navarro et al. |
| 6,035,312 A | | 3/2000 | Hasegawa |
| 6,151,358 A | | 11/2000 | Lee et al. |
| 6,246,773 B1 | * | 6/2001 | Eastty ................ 381/71.11 |
| 6,396,872 B1 | | 5/2002 | Sugiyama |
| 6,437,932 B1 | | 8/2002 | Prater et al. |
| 6,483,872 B2 | | 11/2002 | Nguyen |
| 6,622,118 B1 | * | 9/2003 | Crooks et al. ............. 702/190 |
| 6,735,304 B2 | * | 5/2004 | Hasegawa ............. 379/406.08 |
| 6,744,886 B1 | | 6/2004 | Benesty et al. |
| 6,757,384 B1 | | 6/2004 | Ketchum et al. |
| 6,768,796 B2 | | 7/2004 | Lu |
| 2002/0114445 A1 | * | 8/2002 | Benesty et al. ........ 379/406.01 |
| 2003/0072362 A1 | | 4/2003 | Awad et al. |
| 2003/0074381 A1 | * | 4/2003 | Awad et al. ................ 708/322 |
| 2003/0084079 A1 | * | 5/2003 | Awad et al. ................ 708/322 |

OTHER PUBLICATIONS

Adaptive filters; Theroy and Applications/B. Farhang-Boroujeny. John Wiley & Sons Ltd. (chapter 12, pp. 413–437).

Numerical recipes in C: the art of scientific computing/ William H. Press. Cambridge University Press (chapters 1–2, pp. 1–99).

Linear Predictive Spectral Shaping for Acoustical Echo Cancellation. Sanro Zlobec. Department of Electrical Engineering, McGill University, Montreal, Nov. 1995.

* cited by examiner

METHOD AND APPARATUS FOR GENERATING A SET OF FILTER COEFFICIENTS FOR A TIME UPDATED ADAPTIVE FILTER

CROSS-REFERENCES TO RELATED APPLICATION

This application is related to the following applications:
1. U.S. patent application Ser. No. 09/925,194 entitled, "Method and Apparatus for Providing an Error Characterization Estimate of an Impulse Response Derived using Least Squares", filed on Aug. 8, 2001 by Awad T. et al. and currently pending.
2. U.S. patent application Ser. No. 09/925,247 entitled, "Method and Apparatus for Generating a Set of Filter Coefficients Providing Adaptive Noise Reduction", filed on Aug. 8, 2001 by Awad T. et al. and currently pending.
3. U.S. patent application Ser. No. 09/925,545 entitled, "Method and Apparatus for Generating a Set of Filter Coefficients", filed on Aug. 8, 2001 by Awad T. et al. and currently pending.

The contents of the above noted documents are hereby incorporated by reference.

FIELD OF THE INVENTION

The present invention relates generally to time updated adaptive system and, more particularly, to a method and apparatus for generating time updated filter coefficients for use in a time updated adaptive filter as can be used in echo cancellation devices, equalizers and in general systems requiring time updated adaptive filtering.

BACKGROUND

Various adaptive filter structures have been developed for use in time updated adaptive systems to solve acoustical echo cancellation, channel equalization and other problems; examples of such structures include for example, transversal, multistage lattice, systolic array, and recursive implementations. Among these, transversal finite-impulse-response (FIR) filters are often used, due to stability considerations, and to their versatility and ease of implementation. Many algorithms have also been developed to adapt these filters, including the least-mean-square (LMS), recursive least-squares, sequential regression, and least-squares lattice algorithms. The LMS algorithm is the most commonly used algorithm. It requires neither matrix inversion nor the calculation of correlation matrices, and therefore is often selected to perform the adaptation of the filter coefficients.

A deficiency of the LMS algorithm is that it requires the selection of a "seed" factor value ($\mu$), also referred to as the step size or gain. The "seed" factor value ($\mu$) permits the adaptation of the filter coefficients using the LMS method and also allows the filter coefficients to converge. The seed factor value ($\mu$), which may be constant or variable, plays an important role in the performance of the adaptive system. For example, improper selection of the "seed" factor value ($\mu$) may cause the adaptive filter to diverge thereby becoming unstable. For more details regarding the convergence properties, the reader is invited to refer to B. Widrow and Steams, S. D., *Adaptive Signal Processing*, Prentice-Hall, Englewood Cliffs, N.J., 1985. The content of this document is hereby incorporated by reference. A proper selection of the seed factor value ($\mu$) requires knowledge of the characteristics of the signals that will be processed by the time updated adaptive filter. Consequently, a same "seed" factor value ($\mu$) may be suitable in an adaptive filter in a first system and unsuitable in an adaptive filter in a second system due to the characteristics of the signals being processed.

Consequently, there is a need in the industry for providing a novel method and apparatus for adapting time updated filter that alleviates, at least in part, the deficiencies associated with existing method and apparatuses.

SUMMARY OF THE INVENTION

In accordance with a broad aspect, the invention provides a method for producing a set of filter coefficients. The method includes receiving a sequence of samples of a first signal and a sequence of samples of a second signal, where the second signal includes a component that is correlated to the first signal. The method also includes receiving a scheduling signal including a succession of scheduling commands, the scheduling command indicating that a new set of filter coefficients is to be computed. The scheduling signal is such that a new scheduling command is issued when at least two samples of the first signal are received subsequent to a previously issued scheduling command. In response to a scheduling command, a set of filter coefficients is generated at least in part on the basis of the first and second signals. The set of filter coefficients is such that when the set of filter coefficients is applied by a filter on the first signal, an estimate of the component correlated to the first signal is generated. An output signal indicative of the set of filter coefficients is then released.

Advantageously, the use of a scheduling signal including a succession of scheduling commands allows a better utilization of computing resources for the computations of filter coefficients. The intervals between the scheduling commands in the scheduling signals depend on the time varying characteristics of the system in which the method for generating time updated filter is being used and are determined on the basis of heuristic measurements. In other words, by providing a scheduling signal including a succession of scheduling commands and by selecting the intervals between the scheduling commands based on heuristic performance measurements, the computational costs of computing a set of filter coefficient for each sample can be avoided without significantly deteriorating the apparent adaptation quality of the adaptive filter.

In a non-limiting example, the method for producing a set of filter coefficients is implemented in an adaptive filter of an echo canceller for canceling echo in a return path of a communication channel. For example, for an echo canceling device, the filter coefficients may only need to be recomputed every second (i.e. once every second) without noticeably affecting the performance of the echo canceller. Therefore, assuming that 8000 samples of the first and second signals are received every second (sampling rate of 8000 Hz), a new set of filter coefficients would be computed every 8000 samples, according to the above time period, and so scheduling commands would be sent accordingly. It is to be readily appreciated that scheduling commands in the scheduling signal need not be sent at regular intervals and may have time varying characteristics without detracting from the spirit of the invention. In another specific example of implementation, the scheduling commands are asynchronous and are issued on the basis heuristic measurements of the time varying characteristics of the input signals.

In a specific example of implementation, a least squares algorithm is applied on the first and second signals to derive the set of filter coefficients.

For each received sample of the first signal, the sequence of samples of the first signal is processed to generate a first set of data elements, where the first set of data elements is a compressed version of a second set of data elements.

Continuing the specific implementation, for each received samples of the first and the second signals, the sequences of samples of the first and second signal are processed to generate a third set of data elements. In a non-limiting example, the third set of data elements is indicative of a set of cross-correlation data elements for the sequence of samples of the first signal and the sequence of samples of the second signal.

Continuing the specific implementation, in response to a scheduling command, the first set of data elements is processed to generate the second set of data elements. In a non-limiting example, the second set of data elements is indicative of a set of auto-correlation data elements for the sequence of samples of the first signal, the set of auto-correlation data elements being a representation of a two-dimensional matrix data structure. The first set of data elements includes a sub-set of the set of auto-correlation data elements, the sub-set of auto-correlation data elements corresponding to a row of the two-dimensional matrix data structure. More specifically, the two-dimensional matrix data structure is of dimension N×N, and the first set of data elements includes a sub-set of N auto-correlation data elements corresponding to a row of the two-dimensional matrix data structure. The first set of data elements also includes a first sample set including the first N−1 received samples of the first signal and a second sample set including the last N−1 received samples of the first signal. In response to a scheduling command, the two-dimensional matrix data structure is generated on the basis of the first sample set, the second sample set and the sub-set of N auto-correlation data elements.

In other words, for each received sample of the first signal, the sub-set of N auto-correlation data elements, elements of the second sample set and, if applicable, elements of the first sample set are updated. The generation of the two-dimensional N×N auto-correlation matrix data structure is delayed until receipt of a scheduling command.

Advantageously, the above allows maintaining the context of the two-dimensional N×N auto-correlation matrix data structure by maintaining a compressed version thereof, namely the sub-set of N auto-correlation data elements, the first sample set and the second sample set.

Continuing the specific implementation, the second set of data elements and the third set of data elements are then processed to generate the set of filter coefficients. In a non-limiting example, for each new received sample of the first signal and sample of the second signal, a set of previously received samples of the first signal and the new sample of the first signal are processed to update the first set of data elements. The set of previously received samples of the first signal (including the new sample) and the new sample of the second signal are processed to update the set of cross-correlation data elements. In response to a scheduling command, the first set of data elements is processed to generate the second set of data elements being a representation of the auto-correlation matrix data structure. The auto-correlation matrix data structure and the cross-correlation data elements are then processed to derive a set of filter coefficients.

Advantageously, this method allows maintaining the context of the system by maintaining the first signal's auto-correlation data elements and the cross-correlation of the first signal with the second signal. The generation of a new set of filter coefficients is delayed until a scheduling command is received.

In a non-limiting example, a Cholesky decomposition method is applied to the auto-correlation matrix data structure to derive a lower triangular matrix data structure and an upper triangular matrix data structure. The lower triangular matrix data structure and the upper triangular matrix data structure are then processed on the basis of the cross-correlation data elements to derive the set of filter coefficients.

In accordance with another broad aspect, the invention provides an apparatus for implementing the above-described method.

In accordance with yet another broad aspect, the invention provides a computer readable medium including a program element suitable for execution by a computing apparatus for producing a set of filter coefficients in accordance with the above described method.

In accordance with yet another broad aspect, the invention provides an adaptive filter including a first input for receiving a sequence of samples from a first signal and a second input for receiving a sequence of samples of a second signal. The second signal includes a component that is correlated to the first signal. The adaptive filter also includes a filter adaptation unit including a scheduling controller, a processing unit and an output. The scheduling controller is operative for generating a scheduling signal including a succession of scheduling commands, a scheduling command indicating that a new set of filter coefficients is to be computed. The scheduling signal is such that a new scheduling command is issued when at least two samples of the first signal are received subsequent to a previously issued scheduling command. The processing unit is responsive to a scheduling command from the scheduling controller to generate a set of filter coefficients at least in part on the basis of the first and second signals. The output releases an output signal indicative of the set of filter coefficients generated by the processing unit. The adaptive filter also includes a filter operatively coupled to the first input and to the output of the filter adaptation unit. The filter is operative to apply a filtering operation to the first signal on the basis of the set of filter coefficients received from the filter adaptation unit to generate an estimate of the component in the second signal correlated to the first signal.

In accordance with another broad aspect, the invention provides an echo cancellor comprising an adaptive filter of the type described above.

Other aspects and features of the present invention will become apparent to those ordinarily skilled in the art upon review of the following description of specific embodiments of the invention in conjunction with the accompanying figures.

DETAILED DESCRIPTION

Figure 1:
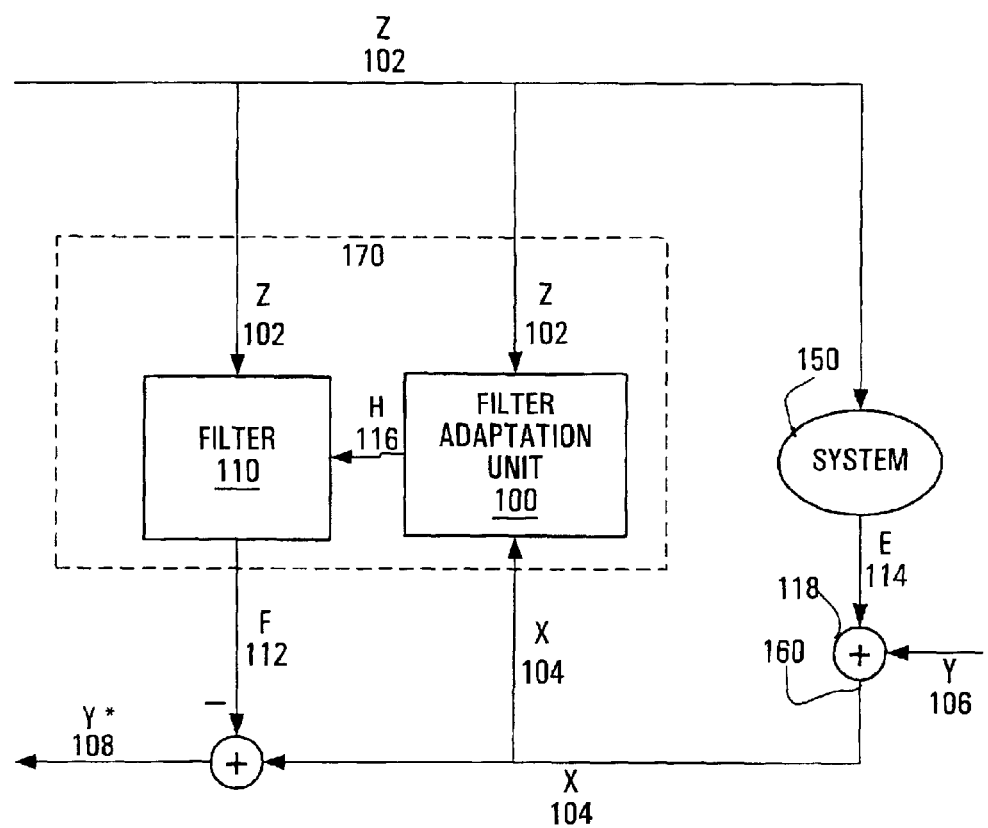
FIG. 1 is a block diagram of a time adaptive system including a filter adaptation unit in accordance with an embodiment of the present invention.

FIG. 1 shows a time adaptive system 170 in accordance with an embodiment of the present invention. In one example of a non-limiting implementation, the time adaptive system 170 is used to remove unwanted components of a return signal Z 102 from a forward signal Y 106. Typically, the return signal Z 102 passes through a system 150 and emerges in the form of a noise signal E 114 which corrupts the forward signal Y 106, resulting in a corrupted forward signal X 104. In a digital system, this corruption process may be modelled as a sample-by-sample addition performed by a conceptual adder 118. Thus, each sample of the corrupted forward signal X 104 is the sum of a component due to the (clean) forward signal Y 106 and another component due to the noise signal E 114 where the noise signal E 114 is correlated to the return signal Z 102.

A non-limiting use of the time adaptive system 170 is in the context of acoustical echo cancellation, for example, in a hands-free telephony system that includes a loudspeaker and a microphone. In this case, the forward signal Y 106 is a locally produced speech signal which is injected into the microphone (represented by conceptual adder 118), the return signal Z 102 is a remotely produced speech signal which is output by the loudspeaker, the system 150 is a room or car interior and the noise signal E 114 is a reverberated version of the return signal Z 102 which enters the same microphone used to pick up the forward signal Y 106. The corrupted forward signal X 104 is the sum of the signals input to the microphone, including the clean forward signal Y 106 as well as the reverberation represented by the noise signal E 114.

Another non-limiting use of the time adaptive system 170 is in the context of electric echo cancellation, for example, where the echo is caused by an analog/digital conversion on the transmission channel rather than by a signal reverberation in a closed space. In this case, the forward signal Y 106 is a locally produced speech signal which travels on the forward path of the communication channel, the return signal Z 102 is a remotely produced speech signal which travels on the return path of the communication channel, the system 150 is an analog/digital conversion unit and the noise signal E 114 is a reflected version of the return signal Z 102 which travels on the same forward path of the communication channel as the forward signal Y 106. The corrupted forward signal X 104 is the sum of the clean forward signal Y 106 as well as the noise signal E 114.

To cancel the corruptive effect of the noise signal E 114 on the forward signal Y 106, there is provided a filter 110, suitably embodied as an adaptive digital filter. The filter 110 taps the return signal Z 102 (which feeds the system 150) and applies a filtering operation thereto. In one embodiment of the present invention, such a filtering operation can be performed by a finite impulse response (FIR) filter that produces a filtered signal F 112.

The filter 110 includes a plurality N of taps at which delayed versions of the return signal Z 102 are multiplied by respective filter coefficients, whose values are denoted by $h_j$, $0 \leq j \leq N-1$. The N products are added together to produce the filter output at time T. Simply stated, therefore, the filtered signal F 112 at a given instant in time is a weighted sum of the samples of the return signal Z 102 at various past instances.

The filter coefficients $h_j$ are computed by a filter adaptation unit 100 configured to receive the return signal Z 102 and the corrupted forward signal X 104. The manner in which the filter adaptation unit 100 processes these signals to compute the filter coefficients $h_j$ is described in greater detail herein below.

Mathematically, the filtered signal F 112 at the output of the filter 110 can be described by the following relationship:

$$f_t = \sum_{i=0}^{N-1} h_i z_{t-i} \qquad \text{Equation 1}$$

where
  t is the current sample time;
  $f_t$ is the value of the filtered signal F 112 at time t;
  $h_j$ is the value of the $j^{th}$ filter coefficient;
  $z_k$ is a sample of the return signal Z 102 at time k; and
  N is the length (i.e., the number of taps) of the filter 110.
For convenience, equation 1 may be represented in matrix form as follows:

$$f_t = \underline{h}^T \underline{z}_t \qquad \text{Equation 2}$$

where the underscore indicates a vector or matrix, where the superscript "$T$" denotes the transpose (not to be confused with the sample time "t" used as a subscript) and where:

$$\underline{h} = \begin{bmatrix} h_0 \\ h_1 \\ \ldots \\ h_{N-1} \end{bmatrix} \text{ and } \underline{z}_t = \begin{bmatrix} z_t \\ z_{t-1} \\ \ldots \\ z_{t-(N-1)} \end{bmatrix} \qquad \text{Equation 3}$$

The output of the filter 110, namely the filtered signal F 112, is subtracted on a sample-by-sample basis from the corrupted forward signal X 104 to yield an estimate, denoted Y* 108, of the clean forward signal Y 106. In a desirable situation, the filter coefficients $h_j$ will be selected so as to cause the resultant signal Y* 108 to be "closer" to the clean forward signal Y 106 than corrupted forward signal X 104. For at least one optimal combination of filter coefficients, the resultant signal Y* 108 will be at its "closest" to the clean forward signal Y 106.

In many cases, it is convenient to define "closeness" in terms of a least-squares problem. In particular, the optimal filter coefficients are obtained by solving an optimisation problem whose object it is to minimise, from among all possible combinations of filter coefficients $h_j$, the mean square difference between instantaneous values of the resultant signal Y* 108 and the clean forward signal Y 106. The actual value of the minimum mean-square error is typically not as important as the value of the optimal filter coefficients that allow such minimum to be reached.

A reasonable assumption is that noise signal E 114 adds energy to forward signal Y 106. Therefore an expression of the least square problem is to minimise the resultant signal Y* 108. Mathematically, the problem in question can be defined as follows:

$$\min_{\underline{h}} E[(y_k^*)^2]_t, \quad \text{Equation 4}$$

where $E[\circ]_t$ denotes the expectation of the quantity "$\circ$" over a subset of time up until the current sample time t. For the purpose of this specific example, the expression $E[\circ]_t$, will denote the summation of the quantity "$\circ$" over a subset of time up until the current sample time t. Another commonly used notation is $\Sigma[\circ]_t$. Therefore, for the purpose of this example the expressions $E[\circ]_t$ and $\Sigma[\circ]_t$ are used interchangeably.

Now, from FIG. 1 it is noted that:

$$y_k^* = x_k - f_k = x_k - \underline{h}_k^T \underline{z}_k \quad \text{Equation 5}$$

and $$x_k = y_k + e_k. \quad \text{Equation 6}$$

Therefore, the problem stated in Equation 4 becomes:

$$\min_{\underline{h}} E[(x_k - \underline{h}^T \underline{z}_k)^2]_t, \quad \text{Equation 7}$$

Expanding the term in square brackets, one obtains:

$$(x_k - \underline{h}^T \underline{z}_k)^2 = x_k^2 - 2x_k \underline{h}^T \underline{z}_k + (\underline{h}^T \underline{z}_k)^2. \quad \text{Equation 8}$$

Taking the expected value of both side of equation 8, one obtains:

$$E[(x_k - \underline{h}^T \underline{z}_k)^2]_t = E[x_k^2]_t - 2E[x_k \underline{h}^T \underline{z}_k]_t + E[\underline{h}^T \underline{z}_k \underline{z}_k^T \underline{h}]_t \quad \text{Equation 9}$$

Minimizing the above quantity leads to a solution for which the resultant signal Y* 108 will be at its minimum and likely at its "closest" to the clean forward signal Y 106. To minimize this quantity, one takes the derivative of the right-hand side of Equation 9 with respect to the filter coefficient vector $\underline{h}$ and sets the result to zero, which yields the following:

$$\frac{d}{d\underline{h}}(E[x_k^2]_t - E[2x_k \underline{h}^T \underline{z}_k]_t + E[\underline{h}^T \underline{z}_k \underline{z}_k^T \underline{h}]_t) = \quad \text{Equation 10}$$
$$-2E[x_k \underline{z}_k]_t + 2E[\underline{z}_k \underline{z}_k^T \underline{h}]_t = 0.$$

Thus, an "optimal" set of filter coefficients $h^*_j$ solves the set of equations defined by:

$$E[\underline{z}_k \underline{z}_k^T]_t \underline{h}^* = E[x_k \underline{z}_k]_t. \quad \text{Equation 11}$$

It is noted that equation 11 expresses the filter coefficient optimisation problem in the form $Ah=B$, where $A=E[\underline{z}_k \underline{z}_k^T]_t$ and $B=E[x_k \underline{z}_k]_t$ and that the matrix A is symmetric and positive definite for a non-trivial signal Z 102. The usefulness of these facts will become apparent to a person of ordinary skill in the art upon consideration of later portions of this specification.

It is further noted that since the properties of the signals Z 102 and X 104 change with time, so too does the optimal combination of filter coefficients $h^*_j$, $0 \leq j \leq N-1$, which solves the above problem in Equation 11. The rate at which the filter coefficients are re-computed by the filter adaptation unit 100 and the manner in which the computations are effected are now described in greater detail with reference to FIG. 2, which depicts the filter adaptation unit 100 in greater detail.

The filter adaptation unit 100 includes a first input 252 for receiving a sequence of samples of a first signal Z 102, a second input 254 for receiving a sequence of samples of a second signal X 104, a scheduling controller 204, a processing unit 250 and an output 256 for releasing an output signal indicative of a set of filter coefficients 116.

The scheduling controller 204 is operative for generating a scheduling signal including a succession of scheduling commands. A scheduling command indicates that a new set of filter coefficients is to be computed by the processing unit 250. The scheduling signal is such that a new scheduling command is issued when a group of at least two samples of the first signal Z 102 are received subsequent to a previously issued scheduling command.

In other words, the scheduling command indicates that one set of filter coefficients is generated for the group of at least two samples.

The intervals between the scheduling commands in the scheduling signal depend on the time varying characteristics of time adaptive system 150. In a non-limiting implementation, the intervals between the scheduling commands are determined on the basis of heuristic measurements. For example, if the time adaptive system 150 is an echo canceller for canceling echo in a return path of a communication channel, the set of filter coefficients may only need to be recomputed every second in order for the filter 110 to adequately track the time varying characteristics of the time adaptive system 150. Therefore, assuming that 8000 samples of the first and second signals are received every second (sampling rate of 8000 Hz), a new set of filter coefficients would be computed every 8000 samples and so a scheduling command would be generated by the scheduling controller every second (8000 samples). It is to be readily appreciated that scheduling commands in the scheduling signal need not be sent at regular intervals and may have time varying characteristics without detracting from the spirit of the invention. In another specific example of implementation, the scheduling commands is asynchronous and is issued on the basis heuristic measurements of the time varying characteristics of the input signals X 104 and Z 102.

The processing unit 250 receives the first signal Z 102 and the second signal X 104 from the first input 252 and the second input 254 respectively. The processing unit 250 is responsive to a scheduling command from the scheduling controller 204 to generate a set of filter coefficients at least in part on the basis of the first signal Z 102 and the second signal 104. In a non-limiting example, the processing unit 250 applies a least squares method on the first and second signals to derive the set of filter coefficients 116. The processing unit 250 generates a set of coefficients $h_j$, $0 \leq j \leq N-1$ by solving equation 11 reproduced below:

$$E[\underline{z}_k \underline{z}_k^T]_t \underline{h}^* = E[x_k \underline{z}_k]_t. \quad \text{Equation 11}$$

Figure 2:
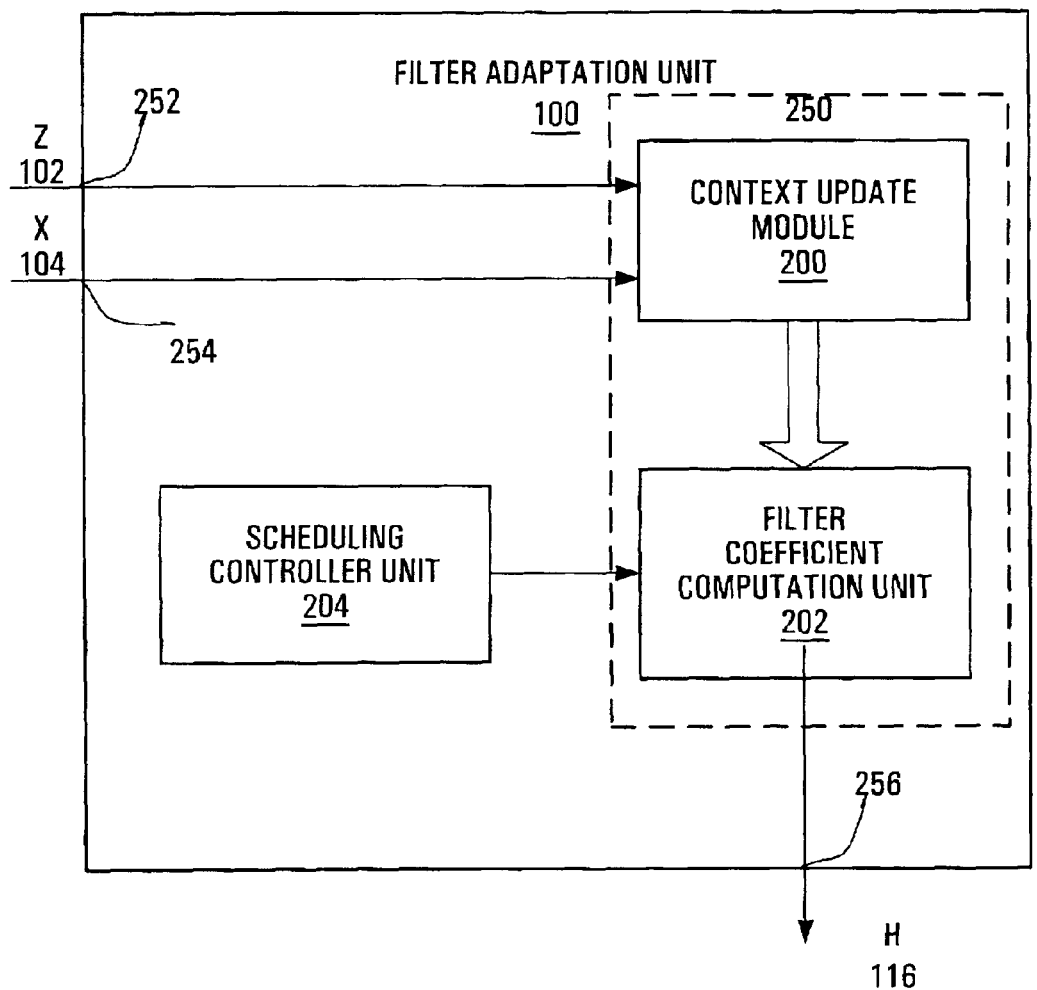
FIG. 2 is a block diagram of the filter adaptation unit of FIG. 1 including a scheduling controller unit 204, a context update module 200 and a filter coefficient computation unit 202 in accordance with a specific example of implementation of the invention.

The processing unit 250 depicted in FIG. 2 includes a context update module 200 and a filter coefficient computation unit 202.

The context update module 200 receives the sequence of samples of the first signal Z 102 and the sequence of samples of the second signal X 104. The context update module 200 generates and maintains contextual information of the first signal Z 102 and the second signal X 104. The context update module maintains sufficient information about signals Z 102 and X 104 to be able to derive $E[\underline{z}_k\underline{z}_k^T]_t$ and $E[x_k\underline{z}_k]_t$ for the current time t. For each new received sample of signals Z 102 and X 104, the contextual information is updated. This contextual information is then used by the filter coefficient computation unit 202 to generate the set of filter coefficients 116.

In a specific implementation, the contextual information comprises a first set of data elements and a third set of data elements. The first set of data elements is a compressed version of a second set of data elements, where the second set of data elements is indicative of the auto-correlation of signal Z 102 $E[\underline{z}_k\underline{z}_k^T]_t$. In a non-limiting example, the first set of data elements includes a set of N auto-correlation data elements of the first signal Z 102 as well as sets of samples of signal Z 102. The third set of data elements is a set of cross-correlation data elements $E[x_k\underline{z}_k]_t$ of the first signal Z 102 with the second signal X 104.

The filter coefficient computation unit 202, in response to a scheduling command from the scheduling controller 204, makes use of the contextual information provided by the context update module to generate a set of filter coefficients 116. The filter coefficient computation unit 202 delays the computation of a new set of filter coefficients until the receipt of a scheduling command. In response to a scheduling command, the filter coefficient computation unit 202 processes the first set of data elements and expands it to derive the second set of data elements to obtain $E[\underline{z}_k\underline{z}_k^T]_t$. The second set of data elements and the third set of data elements are then processed to generate a set of filter coefficients by applying a least squares method. The set of filter coefficients is such that when the set of filter coefficients are applied by filter 110 on the first signal Z 102, a filtered signal F 112 which is an estimate of the component correlated to the signal Z 102 in the second signal X 104, namely signal E 114, is generated. The filter coefficient computation unit 202 solves equation 11 reproduced below:

$$E[\underline{z}_k\underline{z}_k^T]_t \underline{h}^* = E[x_k\underline{z}_k]_t. \quad \text{Equation 11}$$

In a non-limiting example, the second set of data element can be represented by an N×N symmetric matrix "A" describing the expected auto-correlation of signal Z 102, $E[\underline{z}_k\underline{z}_z^T]_t$. Matrix "A" is symmetric and positive definite. The third set of data elements, indicative of the expected cross-correlation between signal Z 102 and signal X 104, can be represented by a vector "B" of M elements, $E[x_k\underline{z}_k]_t$. Finally the set of filter coefficients can be represented by a third vector $\underline{h}^*$. The relationship between "A", "B" and $\underline{h}^*$ can be expressed by the following linear equation:

$$A\underline{h}^* = B \quad \text{Equation 12}$$

If M=N, a single vector $\underline{h}^*$ can be computed from the above equation. If M>N, then a vector $\underline{h}^*$ can be computed for each N elements of vector "B". There are many known methods that can be used to solve a linear equation of the type described in equation 12 and consequently these will not be described further here.

The generated set of filter coefficients $h_j$, $0 \leq j \leq N-1$ 116 is then released at the output 256 for use by the adaptive filter 110.

The Context Update Module

Figure 3:
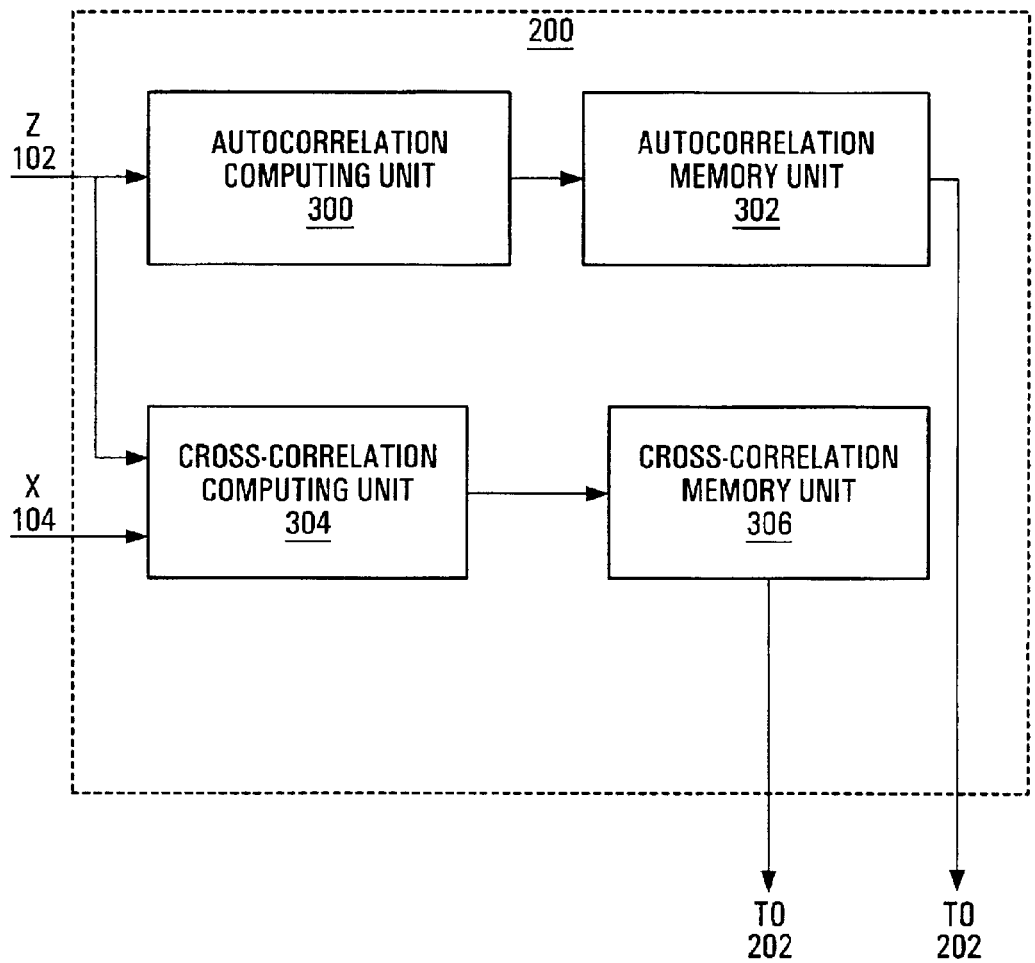
FIG. 3 is functional block diagrams of the context update module 200 of the filter adaptation unit in accordance with a specific non-limiting example of implementation of the invention.

FIG. 3 depicts the context update module 200 in greater detail. The context update module 200 includes an auto-correlation computing unit 300 and a cross-correlation computing unit 304.

The auto-correlation computing unit 300 generates a first set of data elements indicative of a compressed version of a second set of data elements. The second set of data elements is indicative of an auto-correlation data structure for the sequence of samples of the first signal Z 102 and is indicative of $E[\underline{z}_k\underline{z}_k^T]_t$. In a specific example, the second set of data elements can be represented by an N×N auto-correlation matrix (A) 700 of the type shown in FIG. 7 including $N^2$ entries. The N×N auto-correlation matrix (A) 700 is symmetric meaning that:

$$A = A^T$$

The matrix A is also positive definite meaning that the inverse of matrix A exists. Since matrix A is an auto-correlation matrix it will be positive definite when signal Z 102 is non-trivial. The first set of data elements includes a sub-set of N auto-correlation data elements selected from the $N^2$ entries in the N×N auto-correlation matrix 700. In a non-limiting example, the sub-set of N auto-correlation data elements is indicative of the first row of the N×N auto-correlation matrix 700. As the auto-correlation matrix 700 is a symmetric matrix, it will readily appreciated that the set of N auto-correlation data elements may also be indicative of the first column of the N×N auto-correlation matrix 700. It will become apparent to a person of ordinary skill in the art upon consideration of later portions of this specification that, although the specific example described in this specification includes a sub-set of N auto-correlation data elements indicative of the first row of the N×N auto-correlation matrix 700, the sub-set of N auto-correlation data elements can be indicative of any one row (or column) of the N×N auto-correlation matrix 700 without detracting from the spirit of the invention.

For each received sample of the first signal Z 102, the auto-correlation computing unit computes the following:

$$E[z_k z_k^T]_{t,row0} = \sum_{i=0}^{t-N} z_i z_{i+j} \text{ for } j = 0 \ldots N-1 \quad \text{Equation 13}$$

where $z_k$ is a sample of Z at time k, t is the current sample time and N is the window size for the auto-correlation. In the mathematical expression shown in equation 2, $E[z_k z_k^T]_{t,row0}$ denotes a computation of a sub-set of the expected value of the auto-correlation of the first signal Z since time 0 until the current sample at time t. $E[z_k z_k^T]_{t,row0}$ is the first row of the N×N auto-correlation matrix 700 and includes a set of N auto-correlation data elements. For the purpose of simplicity, we will refer the set of N auto-correlation data elements as vector ZZ.

The first set of data elements also includes sets of samples of signal Z 102. The sets of samples in combination with the sub-set of N auto-correlation data elements allow the second set of data elements indicative N×N auto-correlation matrix 700 to be derived. The derivation of the second set of data elements on the basis of the first set of data elements will be described later on in the specification. The first set of data elements is stored in an auto-correlation memory unit 302.

Figure 5:
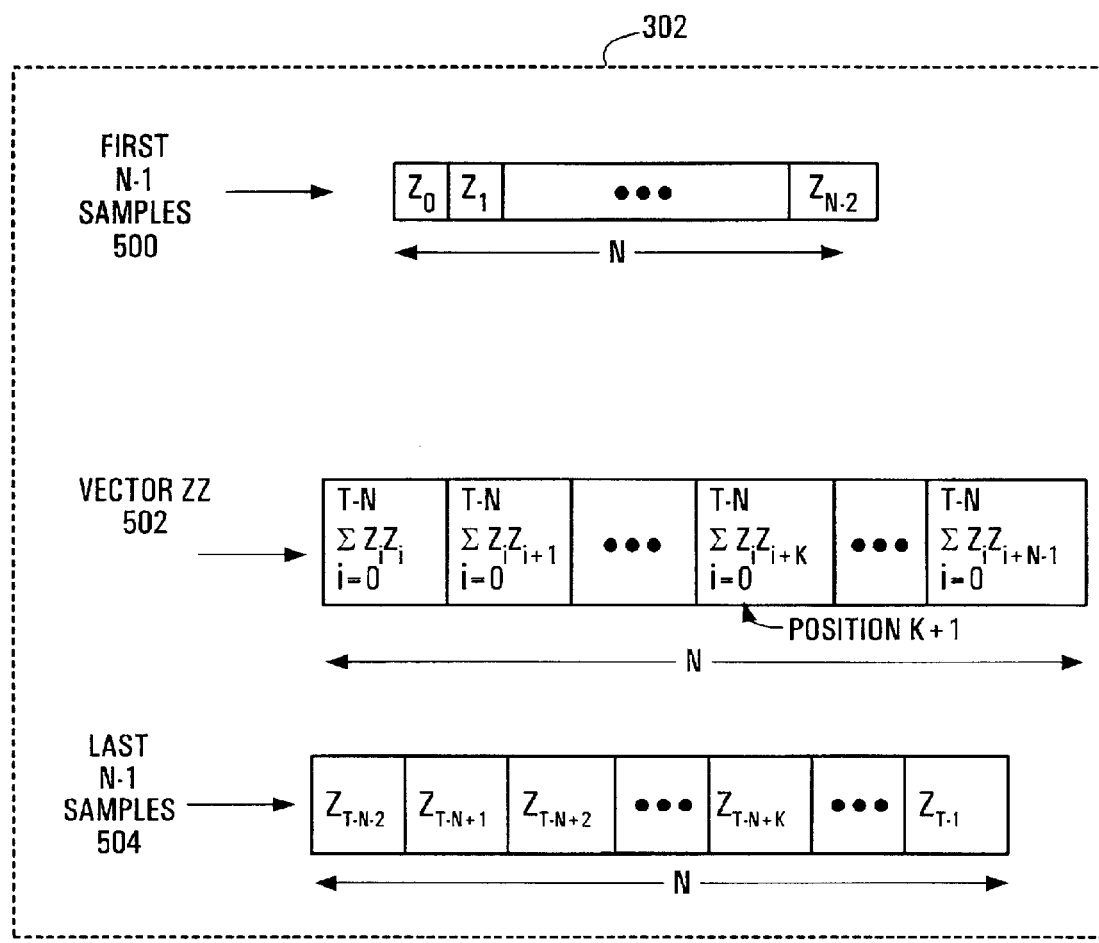
FIG. 5 is a block diagram of a data structure including the first set of data elements in accordance with a non-limiting example of implementation of the invention.

FIG. 5 shows in greater detail the auto-correlation memory unit 302 storing the first set of data elements. As depicted, the first set of data elements includes a first sample set 500 including the first N−1 received samples of the first signal Z 102, a sub-set of N auto-correlation data elements 502 (vector ZZ) and a second sample set 504 including the last N−1 received samples of the first signal. In a non-limiting example, each of the first set 500 of data elements, the sub-set of N auto-correlation data elements (vector ZZ)

502 and the second set of data elements 504 is stored in a vector data structure. For each received sample of signal Z 102, the content of the auto-correlation memory unit 302 is updated as follows:

when t<=N−1

SAMPLE_SET_#1[$j$]=SAMPLE_SET_#1[$j$+1] $j=0 \ldots N-3$

SAMPLE_SET_#1[$N-2$]=$z_{t-1}$   Equation 14 (SAMPLE_SET_#1)

when t>N−1
No change
for all t

SAMPLE_SET_#2[$j$]=SAMPLE_SET_#2[$j$+1] for $j=0 \ldots N-3$

SAMPLE_SET_#2[$N-2$]=$z_{t-1}$   Equation 15 (SAMPLE_SET_#2)

for t>N−1

$ZZ[j]_t=ZZ[j]_{t-1}+z_{t-N}z_{t-N+j}$ for $j=0 \ldots N-1$   Equation 16 Vector ZZ where SAMPLE_SET_#1 is a vector including the N−1 first samples of signal Z 102 and SAMPLE_SET_#2 is a vector including the N−1 last samples of signal Z 102. On the basis of the above, the computational cost of updating the vector ZZ 502 is N multiply-and-add operations per sample: i.e. cost is N.

Figures 6, 7:
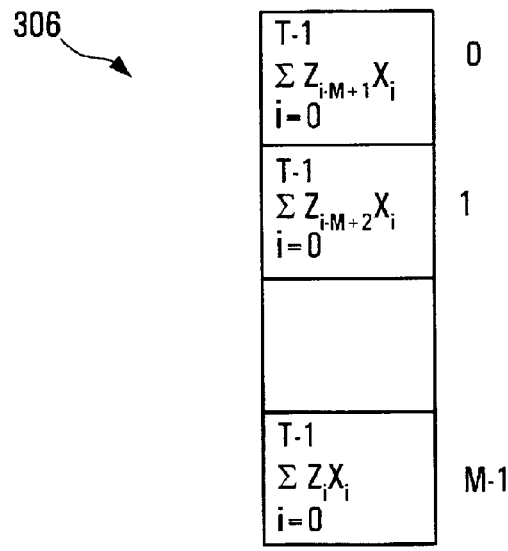
FIG. 6 is a block diagram of a data structure including the third set of data elements in accordance with a non-limiting example of implementation of the invention.
FIG. 7 shows an auto-correlation matrix data structure in accordance with a non-limiting example of implementation of the invention.

The cross-correlation computing unit 304 computes a third set of data elements indicative of a set of cross-correlation data elements between the signals Z 102 and X 104 indicative of $E[x_k z_k]_t$. For each received sample of the first signal Z 102 and the second signal X 104, the cross-correlation computing unit computes the following for $t \geq M$:

$$E[x_k z_k]_t = \sum_{i=0}^{t-1} z_{i+j-M+1} x_i \text{ for } j = 0 \ldots M-1 \quad \text{Equation 17}$$

Where $x_{t-1}$ is a new sample of the signal X 104 at time T, $z_{t-1}$ is a new sample of signal Z 102 at time t and M is the window size for the cross-correlation. In the mathematical expression shown in equation 17, $E[x_k z_k]_t$ denotes a computation of the expected value of the cross-correlation between the first signal Z 102 and the second signal X 104 since time 0 (no sample) until the current sample at time T. $E[x_k z_k]_t$ is a set of M cross-correlation data elements. The M cross-correlation data elements are stored in a data structure in a cross-correlation memory unit 306. FIG. 6 shows the correlation memory unit 306 storing a data structure in the form of a vector of M elements including the M cross-correlation data elements. For the purpose of simplicity, we will refer the set of M cross-correlation data elements as vector XZ. For each received sample of signal X and each received sample of signal Z, the content of vector XZ in the cross-correlation memory unit 606 is updated as follows, again for $t \geq M$:

$XZ[j]_t=XZ[j]_{t-1}+z_{t-1-j}x_{t-1}$ for $j=0 \ldots M-1$   Equation 18

On the basis of the above, the computational cost of updating vector XZ is M multiply-and-add operations per sample, i.e. cost is M.

In a non-limiting embodiment, the context update module 200 includes buffer modules for accumulating samples of signal Z 102 and signal X 104. In this alternative, a plurality of samples of signal Z 102 and a plurality of samples of signal X 104 are accumulated in the buffers and the above described computations are effected for each sample of signal Z 102 and signal X 104 in the buffers.

Alternatively, when the context update module 200 includes buffer modules, the auto-correlation data elements in vector ZZ and the cross-correlation data elements in vector XZ may be computed in the frequency domain using FFT (Fast Fourier transform) techniques.

The process of computing a cross-correlation in the spectral domain between signal Z 102 and signal X 104 will be readily apparent to the person skilled on the art and therefore will not be described further here. The set of cross-correlation data elements resulting from this computation are in the frequency or spectral domain. To obtain the temporal values of the set of cross-correlation data elements, an inverse Fourier transform (IFF) must be applied to the spectral values.

With regard to the auto-correlation computation, an FFT of length 2N is first performed on N samples of signal Z 102, where the N samples have been accumulated in a buffer. The computation of an FFT is well-known in the art to which this invention pertains and as such will not be described further here. The FFT produces 2N complex values in a vector, which will be referred to as $Z_{ft}$. If signal Z 102 is a real signal, values 1 to N−1 of $Z_{ft}$ will be the complex conjugates of values 2N−1 to N+1 (respectively, so 1 is conjugate of 2N−1, 2 is conjugate of 2N−2, etc.) and values 0 and N are real-only. $Z_{ft}$ is the Fourier transform of the last N samples of signal Z 102 and can be represented as follows:

$$Z_{ft} = \begin{bmatrix} Z_{ft} \\ Z_{ft-1} \\ \ldots \\ Z_{ft-2N+1} \end{bmatrix} \quad \text{Equation 19}$$

In order to compute the auto-correlation data elements, we make use of an overlap-add technique. Each element in $Z_{ft}$ is first multiplied with itself to obtain vector $ZZ_{f0t}$. Mathematically, the computation of $ZZ_{f0t}$ can be represented as follows:

$ZZ_{f0t}=Z_{ft} \cdot Z_{ft}$   Equation 20

$Z_{ft}$ is then multiplied with the FFT computed for the set of N samples preceding the current set of N samples of signal Z 102, referred to as $Z_{ft-N}$. This multiplication yields the auto-correlation of the current N samples of signal Z 102 with the previous N samples of signal Z 102, which we shall call $Z_{f1t}$. Mathematically, the computation of $ZZ_{f1t}$ can be represented as follows:

$ZZ_{f1t}=Z_{ft} \cdot Z_{ft-N}$   Equation 21

Between the two computations presented in equations 20 and 21, each sample of signal Z 102 between $z_t$ and $z_{t-(N-1)}$ has been correlated with each sample of signal Z 102 between $z_t$ and $z_{t-(N-1)}$. Following this, $ZZ_{f0t}$ and $ZZ_{f1t}$ are added spectrally to the auto-correlation of the previous set of N samples of signal Z, namely $ZZ_{0t-N}$ and $ZZ_{1t-N}$, to yield $ZZ_{0t}$ and $ZZ_{1t}$ sums. Mathematically, this can be expressed as follows:

$ZZ_{0t}=ZZ_{0t-N}+Z_{f0t}$ $ZZ_{1t}=ZZ_{1t-N}+Z_{f1t}$   Equation 22

Where $ZZ_{0t}$ and $ZZ_{1t}$ are indicative of the last row of the N×N auto-correlation matrix in the spectral (FFT) domain.

To reconstruct the last row of the N×N matrix in the time domain, an IFFT (inverse Fast-Fourier Transform) is performed on each of these vectors to obtain the N samples of the ZZ vector. In this example, vector ZZ is indicative of a set of N data elements indicative of the last row of the N×N auto-correlation matrix in the temporal domain. This only needs to be performed once before each time the N×N matrix is constructed.

In terms of computational costs, since a correlation in the time-domain becomes a multiplication in the frequency domain, significant cost savings in terms of computational requirements can be obtained using FFT techniques when N and M are large.

If Signals Z 102 and X 104 are Real

The cost of computing an FFT of length 2N on N samples on either signal is $\log_2(2N)*2N$. Therefore, the total cost of the FFT for signals Z 102 and X 104 is $4N*\log_2(2N)$. The computational cost of an IFFT is the same as the cost for an FFT, namely $\log_2(2N)*2N$ for a real signal. Therefore, the total cost of the IFFT for signals Z 102 and X 104 is $4N*\log_2(2N)$.

For the Cross-Correlation:

The computational cost of computing the cross-correlation between signal Z and signal X in the spectral domain is 2N complex multiplications, or 8N multiplications.

For the Auto-Correlation:

The computational cost of computing $Z_{f0t}$ is 2 for each element of $Z_{ft}$, because the elements of $Z_{ft}$ are complex numbers. Therefore, the computational cost of computing $Z_{f0t}$ is 2N multiply-and-add operations if signal Z 102 is real. The computational cost of computing $Z_{f1t}$ is N−1 complex multiplications and 2 real multiplications, or 4N−2 multiplications if signal Z 102 is a real signal. The computational cost of spectrally adding $ZZ_{f0t}$ and $ZZ_{f1t}$ to $ZZ_{0t-N}$ and $ZZ_{1t-N}$ is 4N additions.

Therefore, the total cost of maintaining the context of the auto-correlation of signal Z and the cross-correlation between X and Z is:

$4N*\log2(2N)+2N+4N+4N-2+8N$ $4N*\log2(2N)+18*N-2$      Equation 23

Consequently, the cost per sample is (for large N):

$4*\log2(2N)+18$

For a sample rate of SR samples per second, the number of computations required to maintain the context of the auto-correlation of signal Z and the cross-correlation between X and Z is:

$4*SR*\log2(2N)+18*SR$

Since the IFFT is not included at every iteration but only when the filter coefficients are to be computed, these computations are not included here.

If Signals Z 102 and X 104 are Complex

The cost of computing an FFT of length 2N on N samples on either signal is $\log_2(2N)*4N$. Therefore, the total cost of the FFT for signals Z 102 and X 104 is $8N*\log_2(2N)$. The computational cost of an IFFT is the same as the cost for an FFT, namely $\log_2(2N)*4N$ for a complex signal. Therefore, the total cost of the IFFT for signals Z 102 and X 104 is $8N*\log_2(2N)$.

For the Cross-Correlation:

The computational cost of computing the cross-correlation between signal Z 102 and signal X 104 in the spectral domain is 4N complex multiplications, or 16N multiplications.

For the Auto-Correlation:

If signal Z 102 is a complex signal, computational cost of computing $Z_{f0t}$ is 4N. The computational cost of computing $Z_{f1t}$ is 2N complex multiplications or 8N. The computational cost of spectrally adding $ZZ_{f0t}$ and $ZZ_{f1t}$ to $ZZ_{0t-N}$ and $ZZ_{1t-N}$ is 8N additions.

Therefore, the total cost of maintaining the context of the auto-correlation of signal Z and the cross-correlation between X and Z is:

$8N*\log2(2N)+4N+8N+8N+16N$ $8N*\log2(2N)+36*N$      Equation 24

Consequently, the cost per sample is:

$8*\log2(2N)+36$

For a sample rate of SR samples per second, the number of computations required to maintain the context of the auto-correlation of signal Z and the cross-correlation between X and Z is:

$8*SR*\log2(2N)+36*SR$

Since the IFFT is not included at every iteration but only when the filter coefficients are to be computed, these computations are not included here.

The auto-correlation memory unit 302 and the cross-correlation memory unit 306 are operatively coupled to the filter coefficient computation unit 202.

The Filter Coefficient Computation Unit

Figure 4:
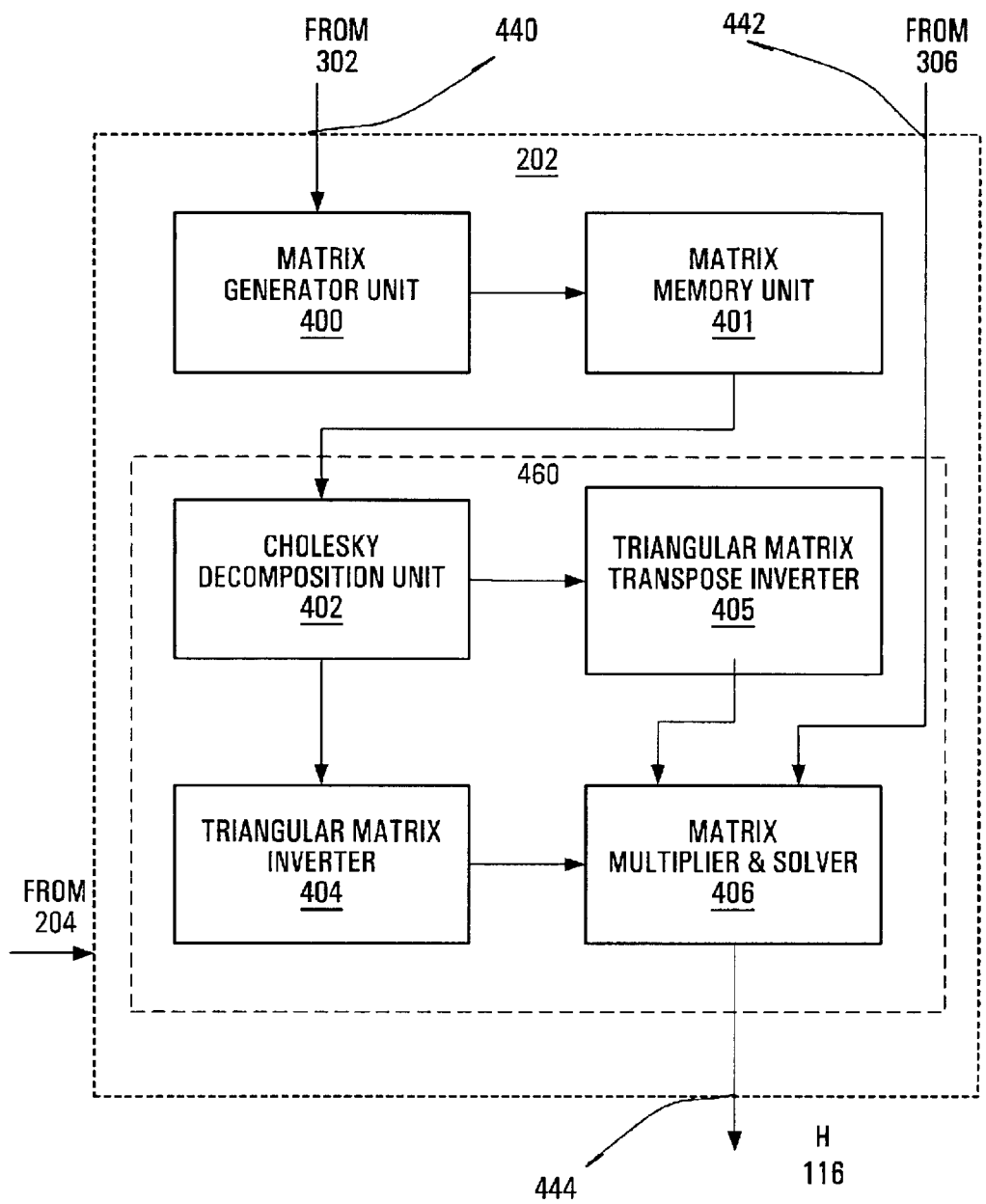
FIG. 4 is a functional block diagram of filter coefficient computation unit 202 of the filter adaptation unit shown in FIG. 2 in accordance with a specific non-limiting example of implementation of the invention.

FIG. 4 depicts the filter coefficient computation unit 202 in greater detail. The filter coefficient computation unit 202 includes a first input 440 for receiving the first set of data element from the auto-correlation memory unit 302, a second input 442 for receiving the third set of data elements from the cross-correlation memory unit 306, a matrix generator unit 400 and associated memory unit 401, a linear solver unit 460 and an output 444 for releasing a set of filter coefficients 116.

The matrix generator unit 400 processes the first set of data elements received from the auto-correlation memory unit 302 to generate the second set of data elements indicative of the corresponding N×N auto-correlation matrix. For each entry in the N×N auto-correlation matrix, a mapping is defined from the first set of data elements in the auto-correlation memory unit 302 to the N×N auto-correlation matrix.

In this specific example, the first set of data elements includes vector ZZ including a sub-set of N auto-correlation data elements indicative of the first row of the N×N auto-correlation matrix. If A is the N×N auto-correlation matrix, the first row of A is equal vector ZZ in memory unit 302 (FIG. 5). Because matrix A is symmetrical, the first column of A is also equal to vector ZZ in memory unit 302. The elements of the matrix can be derived as follows:

$A[0][j]=ZZ[j]$ for $j=0 \ldots N-1$ $A[i][0]=ZZ[j]$ for $i=0 \ldots N-1$ for $i=1 \ldots N-1$ for $j=1 \ldots N-1$ $A[i][j]=ZZ[d]$-SUBTRACT FACTOR+ADD FACTOR   Equation 25 where $d=|j-i|$ $$\text{SUBTRACT FACTOR} = \sum_{k=0}^{\min(i,j)-1} \text{SAMPLE\_SET\_\#1}[k] * \text{SAMPLE\_SET\_\#1}[k+d]$$

$$\text{ADD FACTOR} = \sum_{k=0}^{\min(i,j)-1} \text{SAMPLE\_SET\_\#2}[k] * \text{SAMPLE\_SET\_\#2}[k+d]$$

where i is the row index of the matrix, j is the column index of the matrix and d is the absolute value of the difference between the row and column index. The above described mapping allows expanding the vector ZZ, the first sample set and the second sample set into a second set of data elements indicative of an N×N auto-correlation matrix A.

In an alternative implementation, each row of the matrix A is generated on the basis of the previous row. In addition, since the matrix is symmetric, A[i][j] is equal to A[j][i]. Therefore it is possible to generate a triangular matrix instead of the entire matrix. Storing a triangular matrix also allows the costs in terms of memory use to be N*(N+1)/2 instead of N*N for the complete matrix. In this alternative embodiment, the elements of the matrix can be derived as follows:

A[0][j]=ZZ[j] for j=0 ... N−1 for i=1 ... N−1 for j=i ... N−1

A[i][j]=A[i−1][j−1]−SUBTRACT FACTOR+ADD FACTOR where

SUBTRACT FACTOR=SAMPLE_SET_#1[i−1]*SAMPLE_SET_#1[j−1]

ADD FACTOR=SAMPLE_SET_#2[i−1]*SAMPLE_SET_#2[j−1]  Equation 26

Advantageously, this alternative implementation makes use of two multiply-and-add operations for each element of matrix A that is to be generated. As described above, since only a triangular matrix needs to be computed and stored (A is symmetric), there are N*(N−1)/2 elements of the matrix that are generated, for a computational cost of generating the matrix of N*(N−1).

It will be readily apparent to the reader skilled in the art that the method described here can be applied to a first set of data elements, including any row or any column of the N×N auto-correlation matrix, by providing a suitable mapping. A graphical representation of an example of an auto-correlation matrix data structure A 700 is depicted in FIG. 7 of the drawings. The generated N×N auto-correlation matrix is stored in the matrix memory unit 401. The N×N auto-correlation matrix is a symmetric, positive definite matrix.

The linear solver unit 460 processes the N×N auto-correlation matrix A in matrix memory unit 401 in combination with cross-correlation vector XZ from the cross-correlation memory unit 306 to solve the following linear system for a set of filter coefficients in vector h:

$$A \cdot h = XZ \qquad \text{Equation 27}$$

where A is the N×N square symmetric matrix generated by the matrix generator unit 400, h is an 1×M vector and XZ is an 1×M vector. If M=N, a single vector "h" can be computed from the above equation. If M>N, then a vector "h" of dimension 1×N can be computed for subsets of N elements of vector "XZ". There are many known methods that can be used to solve linear systems. Typically, the inverse of matrix A, namely $A^{-1}$, needs to be computed in order to obtain h:

$$h = A^{-1} \cdot XZ \qquad \text{Equation 28}$$

where $$A \cdot A^{-1} = I$$

where I is an N×N identity matrix.

Typically, computing the inverse of an N×N matrix is complex and requires significant computing resources especially when N is large. Several well known methods have been developed to reduce the complexity of this computation. Examples of such methods include QR substitution, Cholesky decomposition, LU decomposition, Gauss-Jordan elimination amongst others. Any suitable method for solving a set of linear equations may be used by the linear solver unit 460 to derive the vector h including the set of filter coefficients. For more information regarding methods for solving sets of linear equations, the reader is invited to refer to "Numerical Recipes in C: The Art of Scientific Computing", William H. Press et al., Cambridge University Press (Chapter 2). The contents of this document are hereby incorporated by reference.

In a specific non-limiting example of implementation, the linear solver unit 460 makes use of the symmetric and positive definite characteristic of matrix A by using Cholesky decomposition to solve the set of linear equations 8. Conceptually the linear solver unit 460 solves the following set of linear equations:

$$Ah = XZ \qquad \text{Equation 29}$$

Cholesky decomposition generates a matrix W such that $WW^{Transpose} = A$. $WW^{Transpose}$ can be used to replace A in equation 29 as follows:

$$WW^{Transpose}h = XZ \qquad \text{Equation 30}$$

A new variable $y = W^{Transpose}h$ is defined:

$$W^{Transpose}h = y \qquad \text{Equation 31}$$

$W^{Transpose}h$ is substituted for y in equation 30:

$$Wy = XZ \qquad \text{Equation 32}$$

$W^{-1}$ is computed and used to solve for y:

solving for y $$y = W^{-1}XZ \qquad \text{Equation 33}$$

$W^{Transpose-1}$ is computed and the solution to equation 33 is used to solve for h:

solving for h $$h = W^{Transpose-1}y \qquad \text{Equation 34}$$

As shown in FIG. 4, the linear solver unit 460 includes a Cholesky decomposition unit 402, a triangular matrix inverter 404, a triangular matrix transpose inverter 405 and a matrix multiplier and solver 406. The Cholesky decomposition unit 402 processes matrix A to generate a lower triangular matrix W such that:

$$A = W \cdot W^{Transpose} \qquad \text{Equation 35}$$

Following this, the triangular matrix inverter 404 and the triangular matrix transpose inverter 405 process the lower triangular matrix W and its transpose respectively to generate the inverse of matrix W, namely $W^{-1}$, and the inverse of the transpose, namely $W^{Transpose-1}$. Although the linear solver unit 460 depicted in FIG. 4 includes a triangular matrix inverter 404 and triangular matrix transpose inverter 405, these may be implemented by the same physical module without detracting from the spirit of the invention. In general, the inverse of lower triangular matrix W requires fewer computations to compute than that of matrix A.

The matrix multiplier and solver unit 406 then solves the set of linear equations 8 by substitution to obtain the set of filter coefficients in vector h. The matrix multiplier and solver 406 receives $W^{-1}$ and solves for a vector y:

solving for y $$y=W^{-1}XZ \quad \text{Equation 36}$$

The matrix multiplier and solver 406 also receives $W^{Transpose-1}$ and use solution to equation 36 to solve for h as follows:

solving for h $$h=W^{Transpose-1}y \quad \text{Equation 37}$$

Vector h is then released at the output forming a signal including a set of N filter coefficients 116. It is to be appreciated that other methods and implementations for solving a set of linear equations using Cholesky decomposition are possible without detracting from the spirit of the invention. For example, although the implementation depicted in FIG. 4 makes use of triangular matrix inverter/triangular matrix transpose inverter units 405 406, direct solving of the linear equations can be done as well.

A Typical Interaction

Figure 8:
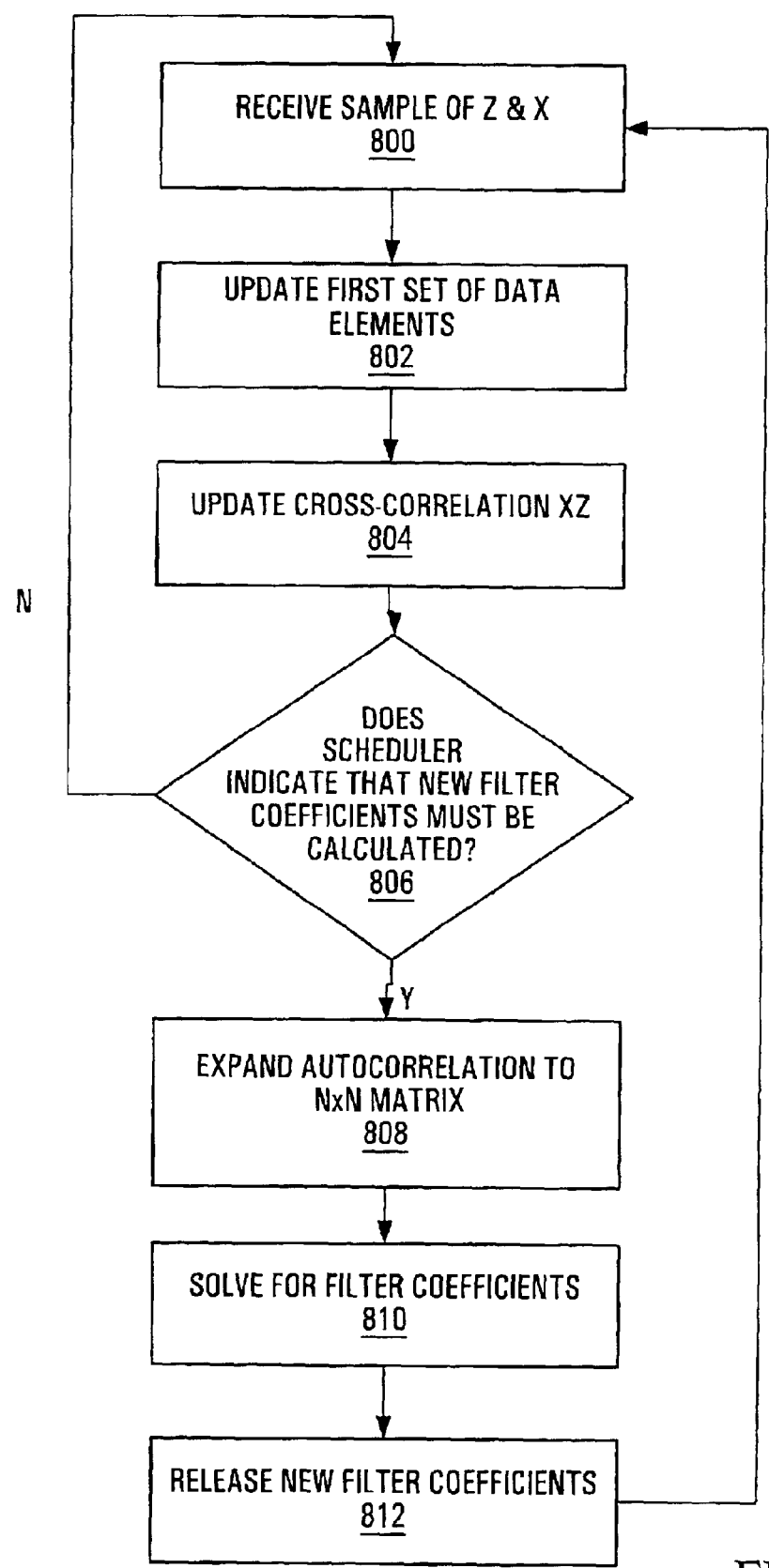
FIG. 8 is a flow diagram of a process for generating a set of filter coefficients in accordance with an example of implementation of the invention.

A typical interaction will better illustrate the functioning of the filter adaptation unit 100. As shown in the flow diagram of FIG. 8, at step 800 the filter adaptation unit 100 receives a new sample of the first signal Z 102 and a new sample of the second signal X 104. At step 802, the context update module 200 updates the first set of data elements. This step 802 includes modifying the content of memory unit 302 (shown in FIG. 3) by: a) updating the sub-set of N auto-correlation data elements forming vector ZZ; b) updating the second sample set including the last N−1 received samples of the first signal Z; and if applicable, c) updating the first sample set including the first N−1 received samples of the first signal Z. Following this, at step 804, the context update module 200 updates the third set of data elements. This step 804 includes modifying the content of memory unit 306 (shown in FIG. 3) by updating the set of cross-correlation data elements in vector XZ. Alternatively, a plurality of samples of signal Z 102 and signal X 104 may be received at step 800 and accumulated in respective buffer units and steps 802 and 804 can be effected on groups of the samples of the buffer units. As a variant, FFT techniques may be used on sets of N samples in the buffer units to update the sub-set of auto-correlation data elements forming vector ZZ and the set of cross-correlation data elements in vector XZ in order to reduce the number of computations required.

At step 806 a test is effected to determine whether a scheduling command was received from the scheduling controller. In the negative, the process returns to step 800 where the filter adaptation unit 100 receives a new sample of the first signal Z 102 and a new sample of the second signal X 104. The loop including steps 800, 802, 804 and 806 is repeated until a scheduling command is received from the scheduling controller 204 (shown in FIG. 2). Typically, several samples of the first and second signals are received by the filter adaptation unit 100 prior to a scheduling command being issued.

When a scheduling command is received, condition 806 is answered in the affirmative and the process proceeds to step 808. At step 808, if the sub-set of N auto-correlation data elements is stored on the spectral domain, an IFFT is first applied to obtain the sub-set of N auto-correlation data elements in the time domain. Similarly, if the set of M cross-correlation data elements is stored on the spectral domain, an IFFT is applied to obtain the set of M auto-correlation data elements in the time domain. At step 808, the sub-set of N auto-correlation data elements forming vector ZZ (in the time domain), the second sample set and the first sample set are expanded into the second set of data elements to generate auto-correlation matrix A. Following this, at step 810, the linear solver unit 460 solves for h the linear set of equations A·h=XZ in order to obtain a new set of filter coefficients. The new set of filter coefficients 116 is then released at step 812.

Advantageously, this method allows maintaining the context of the system by maintaining a subset of the first signal's auto-correlation data elements and the cross-correlation of the two signals X and Z. In a non-limiting example, using FFTs to update the auto-correlation data elements and the cross-correlation data elements, for a given filter length N, the computational cost can be as low as (4*SR*log2N)+(SR*18) (assuming signal Z 102 and signal X 104 are real input signals), where SR is the sampling rate for signals Z 102 and X 104. For example if N is 256 and the sampling rate SR is 8000 samples per second, the computational cost of maintaining the auto-correlation data elements and the cross-correlation data elements may be as low as 350 kips (thousands of instructions per second) by using the methods described in this specification. If signals Z 102 and X 104 are complex input signals, the computational cost of maintaining the auto-correlation data elements and the cross-correlation data elements will be about double the cost as for real input signals. In other words, the number of computations per new sample of signal Z and X to maintain the context of the system is proportional to log2N i.e. O(log2N) where N is the length of the filter.

The generation of a new set of filter coefficients 116 is delayed until a scheduling command is received. The computational costs of generating a new set of filter coefficients is:

$O(N^2)$ to generate the matrix;

$O(N^3/6)$ for the Cholesky decomposition; and $O(N^2)$ for solving the linear equations.

Advantageously, by providing a scheduling signal including a succession of scheduling commands and by selecting the intervals between the scheduling commands based on heuristic performance measurements, the computational costs of computing a set of filter coefficient for each sample can be avoided without significantly deteriorating the apparent adaptation quality of the adaptive filter 110.

Figure 9:
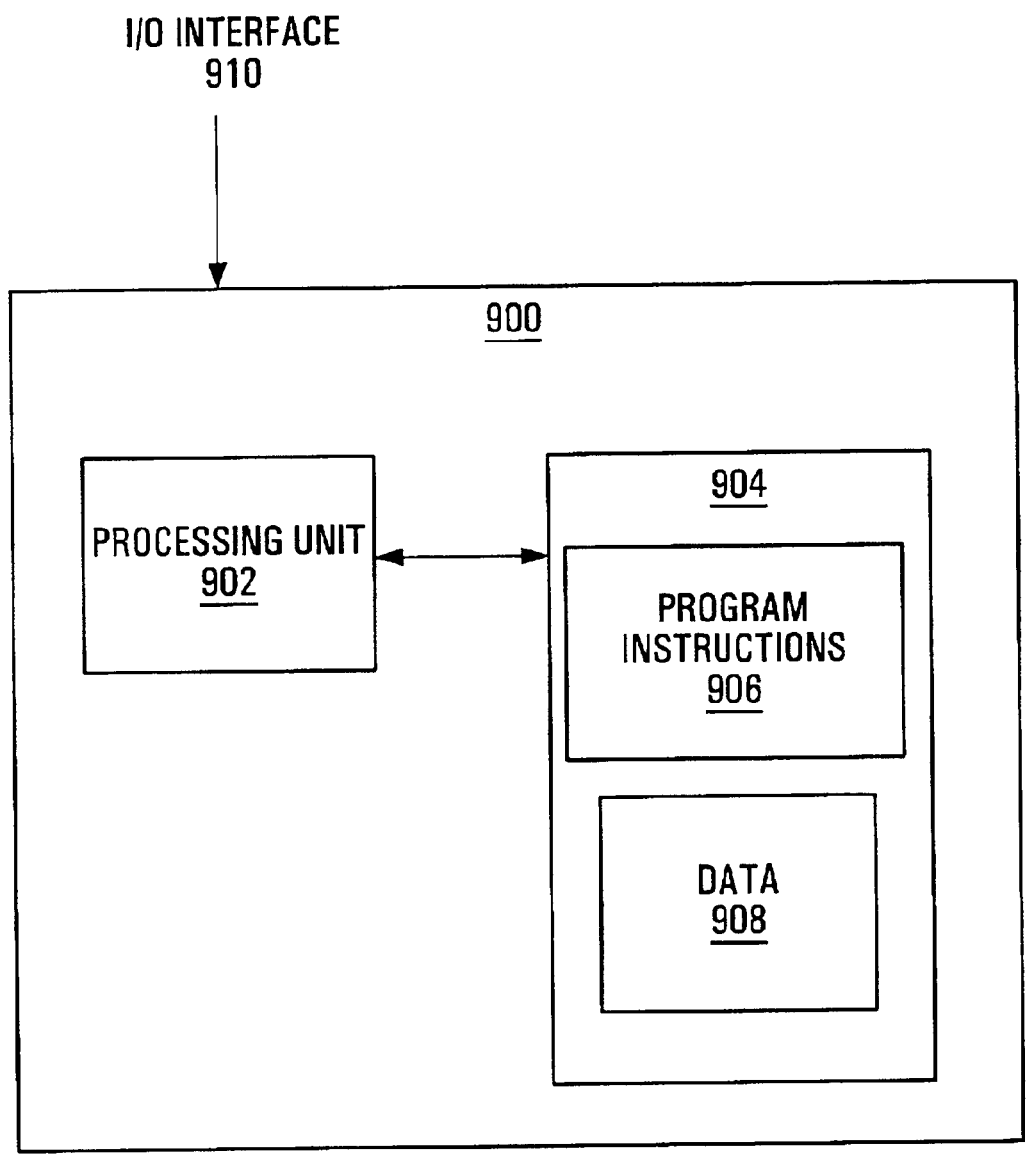
FIG. 9 is a block diagram of an apparatus for generating a set of filter coefficients in accordance with a specific example of implementation of the invention.

The above-described process for producing a set of filter coefficients can be implemented on a general purpose digital computer of the type depicted in FIG. 9, including a processing unit 902 and a memory 904 connected by a communication bus. The memory includes data 908 and program instructions 906. The processing unit 902 is adapted to process the data 908 and the program instructions 906 in order to implement the functional blocks described in the specification and depicted in the drawings. The digital computer 900 may also comprise an I/O interface for receiving or sending data elements to external devices. For example, the I/O interface may be used for receiving the first signal Z 102 and the second signal X 104.

Alternatively, the above-described process for producing a set of filter coefficients can be implemented on a dedicated hardware platform where electrical/optical components implement the functional blocks described in the specification and depicted in the drawings. Specific implementations may be realized using ICs, ASICs, DSPs, FPGA or other suitable hardware platform. It will be readily appreciated that the hardware platform is not a limiting component of the invention.

Although the present invention has been described in considerable detail with reference to certain preferred embodiments thereof, variations and refinements are possible without departing from the spirit of the invention. For example, forgetting factors in the auto-correlation and cross-correlation computations may be used to bias the results towards more recently received samples rather than weighing all samples of the signals equally irrespective of the time they were received. Therefore, the scope of the invention should be limited only by the appended claims and their equivalents.

What is claimed is:

1. A filter adaptation unit suitable for producing a set of filter coefficients, said filter adaptation unit comprising:
   a) a first input for receiving a sequence of samples of a first signal;
   b) a second input for receiving a sequence of samples of a second signal, the second signal including a component which is correlated to the first signal;
   c) a scheduling controller operative for generating a scheduling sign including a succession of scheduling commands, the scheduling command indicating that a new set of filter coefficients is to be computed, the scheduling signal being such that a new scheduling command is issued when at least two samples of the first signal are received subsequent to a previously issued scheduling command;
   d) a processing unit operatively coupled to said first and second inputs, said processing unit being responsive to a scheduling command from said scheduling controller to generate a set of filter coefficients at least in part on the basis of said first and second signals, the set of filter coefficients being such that when the set of filter coefficients are applied by a filter on the first signal, an estimate of the component in the second signal is generated, the component being correlated to the first signal;
   e) an output for releasing an output signal indicative of the set of filter coefficients generated by the processing unit.

2. A filter adaptation unit as defined in claim 1, wherein said processing unit is operative for applying a least squares method on the first and second signals to derive the set of filter coefficients.

3. A filter adaptation unit suitable for producing a set of filter coefficients, said filter adaptation unit comprising:
   a) a first input for receiving a sequence of samples of a first signal;
   b) a second input for receiving a sequence of samples of a second signal, the second signal including a component which is correlated to the first signal;
   c) a scheduling controller operative for generating a scheduling sign including a succession of scheduling commands, the scheduling command indicating that a new set of filter coefficients is to be computed, the scheduling sign being such that a new scheduling command is issued when at least two samples of the first signal are received subsequent to a previously issued scheduling command;
   d) a processing unit operatively coupled to said first and second inputs:
      i. for a new sample of said first signal, said processing unit being operative for processing said sequence of samples of the first signal to generate a first set of data elements, the first set of data elements being a compressed version of a second set of data elements;
      ii. for a new sample of said second signal, said processing unit being operative for processing said sequence of samples of the second signal to generate a third set of data elements;
      iii. in response to a scheduling command from said scheduling controller, said processing unit being operative for:
         (a) processing said first set of data elements to generate the second set of data elements;
         (b) processing the second set of data elements and the third set of data elements to generate a set of filter coefficients by applying least squares method, the set of filter coefficients being such that when the set of filter coefficients are applied by a filter on the first signal, an estimate of the component in the second signal is generated, the component being correlated to the first signal;
   e) an output for releasing an output signal indicative of the set of filter coefficients generated by the processing unit.

4. A filter adaptation unit as defined in claim 3, wherein said second set of data elements is indicative of a set of auto-correlation data elements for the sequence of samples of the first signal, said set of auto-correlation data elements being a representation of a two-dimensional matrix data structure.

5. A filter adaptation unit as defined in claim 4, wherein said first set of data elements includes a sub-set of the set of auto-correlation data elements.

6. A filter adaptation unit as defined in claim 4, wherein said sub-set of the set of auto-correlation data elements corresponds to either one of a row or a column of the two-dimensional matrix data structure.

7. A filter adaptation unit as defined in claim 5, wherein the two-dimensional matrix data structure is of dimension N×N, wherein N is an integer, said first set of data elements including:
   i. a sub-set of auto-correlation data elements, said sub-set of auto-correlation data elements corresponding to either one of a row or a column of the two-dimensional matrix data structure;
   ii. a first sample set including N−1 first received samples of the first signal;
   iii. a second sample set including N−1 last received samples of the first signal;
   b) said processing unit being operative for generating said second set of data elements at least in part on the basis of the first sample set, the second sample set and the sub-set of auto-correlation data elements.

8. A filter adaptation unit as defined in claim 5, wherein said third set of data elements is indicative of a set of cross-correlation data elements for the sequence of samples of the first signal and the sequence of samples of the second signal.

9. A filter adaptation unit as defined in claim 8, wherein for each new received samples of the first and second signals, said processing unit being operative to:
 a) process a set of previously received samples of the first signal and new sample of the first signal to update the first set of data elements;
 b) process the set of previously received samples of the first signal and the new sample of the first signal and a new sample of the second signal to update the set of cross-correlation data elements;
 c) upon receipt of a scheduling command from said scheduling controller:
  i. process the first set of data elements to generate the second set of data elements being a representation of an auto-correlation matrix data structure;
  ii. process the auto-correlation matrix data structure and the cross-correlation data elements to derive a set of filter coefficients.

10. A filter adaptation unit as defined in claim 9, wherein said processing unit is responsive to the scheduling command for:
 a) applying a Cholesky decomposition method to the auto-correlation matrix data structure to derive a lower triangular matrix data structure and an upper triangular matrix data structure;
 b) processing the lower triangular matrix data structure and the upper triangular matrix data structure on the basis of the cross-correlation data elements to derive the set of filter coefficients.

11. A method for producing a set of filter coefficients comprising:
 a) receiving a sequence of samples of a first signal;
 b) receiving a sequence of samples of a second signal, the second signal including a component which is correlated to the first signal;
 c) receiving a scheduling signal including a succession of scheduling commands, the scheduling command indicating that a new set of filter coefficients is to be computed, the scheduling signal being such that a new scheduling command is issued when at least two samples of the first signal are received subsequent to a previously issued scheduling command;
 d) in response to a scheduling command, generating a set of filter coefficients at least in part on the basis of said first and second signals, the set of filter coefficients being such that when the set of filter coefficients are applied by a filter on the first signal, an estimate of the component in the second signal is generated, the component being correlated to the first signal;
 e) releasing an output signal indicative of the set of filter coefficients.

12. A method as defined in claim 11, said method comprising applying a least squares algorithm on the first and second signals to derive the set of filter coefficients.

13. A method as defined in claim 12, wherein said method comprises:
 a) for a new sample of said first signal, processing said sequence of samples of the first signal to generate a first set of data elements, the first set of data elements being a compressed version of a second set of data elements;
 b) for a new sample of said second signal, processing said sequence of samples of the second signal to generate a third set of data elements;
 c) in response to a scheduling command:
  i. processing said first set of data elements to generate the second set of data elements;
  ii. processing the second set of data elements and the third set of data elements to generate the set of filter coefficients.

14. A method as defined in claim 13, wherein said second set of data elements is indicative of a set of auto-correlation data elements for the sequence of samples of the first signal, said set of auto-correlation data elements being a representation of a two-dimensional matrix data structure.

15. A method as defined in claim 14, wherein said first set of data elements includes a sub-set of the set of auto-correlation data elements.

16. A method as defined in claim 14, wherein said sub-set of the set of auto-correlation data elements corresponds to either one of a row or a column of the two-dimensional matrix data structure.

17. A method as defined in claim 15, wherein the two-dimensional matrix data structure is of dimension N×N, wherein N is an integer, said first set of data elements including:
 i. a sub-set of auto-correlation data elements, said sub-set of auto-correlation data elements corresponding to either one of a row or a column of the two-dimensional matrix data structure;
 ii. a first sample set including N−1 first received samples of the first signal;
 iii. a second sample set including N−1 last received samples of the first signal;
said method comprising generating said second set of data elements at least in part on the basis of the first sample set, the second sample set and the sub-set of auto-correlation data elements.

18. A method as defined in claim 15, wherein said third set of data elements is indicative of a set of cross-correlation data elements for the sequence of samples of the first signal and the sequence of samples of the second signal.

19. A method as defined in claim 18, wherein said method further comprises:
 a) for a new received sample of the first signal:
  i. processing a set of previously received samples of the first signal and a new sample of the first signal to update the first set of data elements;
  ii. processing the set of previously received samples of the first signal and the new sample of the first signal and a new sample of the second signal to update the set of cross-correlation data elements;
 b) in response to a scheduling command:
  i. processing the first set of data elements to generate the second set of data elements being a representation of an auto-correlation matrix data structure;
  ii. processing the auto-correlation matrix data structure and the cross-correlation data elements to derive a set of filter coefficients.

20. A method as defined in claim 19, wherein said method comprises, in response to the scheduling command:
 a) applying a Cholesky decomposition method to the auto-correlation matrix data structure to derive a lower triangular matrix data structure and an upper triangular matrix data structure;
 b) processing the lower triangular matrix data structure and the upper triangular matrix data structure on the basis of the cross-correlation data elements to derive the set of filter coefficients.

21. A computer readable medium including a program element suitable for execution by a computing apparatus for producing a set of filter coefficients, the filter coefficients being suitable for use by a filter, said computing apparatus comprising:

a) a memory unit;
b) a processor operatively connected to said memory unit, said program element when executing on said processor being operative for:
   i. receiving a sequence of samples of a first signal;
   ii. receiving a sequence of samples of a second signal, the second signal including a component which is correlated to the first signal;
   iii. receiving a scheduling signal including a succession of scheduling commands, the scheduling command indicating that a new set of filter coefficients is to be computed, the scheduling signal being such that a new scheduling command is issued when at least two samples of the first signal are received subsequent to a previously issued scheduling command;
   iv. in response to a scheduling command, generating a set of filter coefficients at least in part on the basis of said first and second signals, the set of filter coefficients being such that when the set of filter coefficients is applied by a filter on the first signal, an estimate of the component in the second signal is generated, the component being correlated to the first signal;
   v. releasing an output signal indicative of the set of filter coefficients.

22. A computer readable medium as defined in claim 21, said program element when executing on said processor being operative for applying a least squares algorithm on the first and second signals to derive the set of filter coefficients.

23. A computer readable medium as defined in claim 22, wherein said program element when executing on said processor being operative to:
   a) for a new sample of said first signal, process said sequence of samples of the first signal to generate a first set of data elements, the first set of data elements being a compressed version of a second set of data elements;
   b) for a new sample of said second signal, process said sequence of samples of the second signal to generate a third set of data elements;
   c) in response to a scheduling command:
      i. process said first set of data elements to generate the second set of data elements;
      ii. process the second set of data elements and the third set of data elements to generate the set of filter coefficients.

24. A computer readable medium as defined in claim 23, wherein said second set of data elements is indicative of a set of auto-correlation data elements for the sequence of samples of the first signal, said set of auto-correlation data elements being a representation of a two-dimensional matrix data structure.

25. A computer readable medium as defined in claim 24, wherein said first set of data elements includes a sub-set of the set of auto-correlation data elements.

26. A computer readable medium as defined in claim 24, wherein said sub-set of the set of auto-correlation data elements corresponds to either one of a row or a column of the two-dimensional matrix data structure.

27. A computer readable medium as defined in claim 25, wherein the two-dimensional matrix data structure is of dimension N×N, wherein N is an integer, said first set of data elements including:
   iii. a sub-set of auto-correlation data elements, said sub-set of auto-correlation data elements corresponding to either one of a row or a column of the two-dimensional matrix data structure;
   iv. a first sample set including N−1 first received samples of the first signal;
   v. a second sample set including N−1 last received samples of the first signal;
said program element when executing on said processor being operative for generating said second set of data elements at least in part on the basis of the first sample set, the second sample set and the sub-set of auto-correlation data elements.

28. A computer readable medium as defined in claim 25, wherein said third set of data elements is indicative of a set of cross-correlation data elements for the sequence of samples of the first signal and the sequence of samples of the second signal.

29. A computer readable medium as defined in claim 28, wherein said program element when executing on said processor being operative to:
   a) for a new received sample of the first signal:
      i. process a set of previously received samples of the first signal and the new sample of the first signal to update the first set of data elements;
      ii. process the set of previously received samples of the first signal and the new sample of the first signal and a new sample of the second signal to update the set of cross-correlation data elements;
   b) in response to a scheduling command:
      i. process the first set of data elements to generate the second set of data elements being a representation of an auto-correlation matrix data structure;
      ii. process the auto-correlation matrix data structure and the cross-correlation data elements to derive a set of filter coefficients.

30. A computer readable medium as defined in claim 29, wherein in response to the scheduling command said program element when executing on said processor being operative for:
   a) applying a Cholesky decomposition method to the auto-correlation matrix data structure to derive a lower triangular matrix data structure and an upper triangular matrix data structure;
   b) processing the lower triangular matrix data structure and the upper triangular matrix data structure on the basis of the cross-correlation data elements to derive the set of filter coefficients.

31. An adaptive filter comprising:
   a) a first input for receiving a sequence of samples from a first signal;
   b) a second input for receiving a sequence of samples of a second signal, the second signal including a component which is correlated to the first signal;
   c) a filter adaptation unit operatively coupled to said first and second inputs, said filter adaptation unit comprising:
      i. a scheduling controller operative for generating a scheduling signal including a succession of scheduling commands, the scheduling command indicating that a new set of filter coefficients is to be computed, the scheduling signal being such that a new scheduling command is issued when at least two samples of the first signal are received subsequent to a previously issued scheduling command;
      ii. a processing unit responsive to a scheduling command from said scheduling controller to generate a set of filter coefficients at least in part on the basis of said first and second signals;

iii. an output for releasing an output signal indicative of the set of filter coefficients generated by the processing unit;

d) a filter operatively coupled to said first input and to the output of said filter adaptation unit, said filter being operative to apply a filtering operation to the first signal on the basis of the set of filter coefficients received from said filter adaptation unit to generate an estimate of the component in the second signal, the component being correlated to the first signal.

32. An echo cancellor comprising the adaptive filter of claim 31.

* * * * *

UNITED STATES PATENT AND TRADEMARK OFFICE
CERTIFICATE OF CORRECTION

PATENT NO. : 6,999,509 B2
DATED : February 14, 2006
INVENTOR(S) : Thomas J. Awad et al.

It is certified that error appears in the above-identified patent and that said Letters Patent is hereby corrected as shown below:

Column 19,
Line 34, "sign" should be -- signal --.

Column 20,
Line 3, "sign" should be -- signal --.
Line 24, "applying least" should be -- applying a least --.

Column 21,
Line 5, "and new" should be -- and a new --.

Signed and Sealed this

Sixteenth Day of May, 2006

JON W. DUDAS
*Director of the United States Patent and Trademark Office*